(12) United States Patent
Ueda et al.

(10) Patent No.: US 11,443,925 B2
(45) Date of Patent: Sep. 13, 2022

(54) SUBSTRATE SUPPORT AND PLASMA PROCESSING APPARATUS

(71) Applicant: TOKYO ELECTRON LIMITED, Tokyo (JP)

(72) Inventors: Takehiro Ueda, Miyagi (JP); Jun Hirose, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 215 days.

(21) Appl. No.: 16/871,464

(22) Filed: May 11, 2020

(65) Prior Publication Data
US 2020/0365380 A1 Nov. 19, 2020

(30) Foreign Application Priority Data

May 14, 2019 (JP) .............................. JP2019-091640

(51) Int. Cl.
*H01J 37/32* (2006.01)
(52) U.S. Cl.
CPC .... *H01J 37/32733* (2013.01); *H01J 37/3255* (2013.01); *H01J 37/32568* (2013.01); *H01J 37/32697* (2013.01); *H01J 37/32715* (2013.01)
(58) Field of Classification Search
CPC .. B23Q 3/15; H01J 37/32532; H01J 37/3255; H01J 37/32568; H01J 37/32697; H01J 37/32715; H01J 37/32733; H01J 2237/334; H01L 21/67011; H01L 21/67069; H01L 21/6831; H01L 21/6833; H01L 21/68742; H01L 21/68757; H01L 21/68785; H01L 21/68792; H02N 13/00
USPC ..................................... 204/298.15; 118/500
See application file for complete search history.

(56) References Cited

U.S. PATENT DOCUMENTS

| 2011/0315080 A1* | 12/2011 | Choi ................. H01L 21/68742 |
| | | 118/500 |
| 2013/0087286 A1* | 4/2013 | Carducci ........... H01J 37/32743 |
| | | 156/345.43 |
| 2017/0278869 A1 | 9/2017 | Hiramatsu et al. |

FOREIGN PATENT DOCUMENTS

JP 2017-174946 A 9/2017

* cited by examiner

*Primary Examiner* — Rodney G McDonald
(74) *Attorney, Agent, or Firm* — Weihrouch IP

(57) ABSTRACT

A substrate support for use in a plasma processing chamber includes a substrate support body, a lifter pin and a lift mechanism. The substrate support body has a pin through-hole and the pin through-hole has a female-threaded inner wall. The lifter pin has a base segment, an intermediate segment, and a leading segment. The lifter pin is inserted into the pin through-hole, the intermediate segment is male-threaded, and the male-threaded intermediate segment is screwable to the female-threaded inner wall. The lift mechanism is configured to vertically move the lifter pin relative to the substrate support body.

12 Claims, 6 Drawing Sheets

SUBSTRATE SUPPORT AND PLASMA PROCESSING APPARATUS

CROSS-REFERENCE TO RELATED APPLICATIONS

This application claims priority to Japanese Patent Application No. 2019-091640, filed on May 14, 2019, the entire contents of which are incorporated herein by reference.

TECHNICAL FIELD

The present disclosure relates to a substrate support and a plasma processing apparatus.

BACKGROUND

There is known a substrate processing apparatus for performing an etching process or the like on a target object such as a wafer or the like using plasma (see, e.g., Japanese Patent Application Publication No. 2017-174946). The substrate processing apparatus includes a substrate support for holding the target object in a processing chamber that can have a vacuum space therein, for example. The substrate support also serves as an electrode. The substrate processing apparatus applies a predetermined radio-frequency power to the substrate support to process the target object on the substrate support using plasma. The substrate support has through-holes into which lifter pins are inserted. In the substrate processing apparatus, when the target object is transferred, the lifter pins are lifted from the through-holes to support the target object from the backside thereof the target object and separate the target object from the substrate support.

In the substrate processing apparatus, the radio-frequency power that is applied to the substrate support to perform the etching process has a high voltage. When the radio-frequency power applied to the substrate support has the high voltage, abnormal discharge may occur in the through-holes where the lifter pins are inserted. The abnormal discharge may deteriorate the quality of the target object and may decrease the yield of the plasma processing.

The present disclosure provides a technique for suppressing abnormal discharge that occurs when a target object is processed using a plasma.

SUMMARY

In accordance with an aspect of the present disclosure, there is provided a substrate support for use in a plasma processing chamber, including: a body having a pin through-hole, the pin through-hole having a female-threaded inner wall; a lifter pin having a base segment, an intermediate segment, and a leading segment, the lifter pin being inserted into the pin through-hole, the intermediate segment being male-threaded, the male-threaded intermediate segment being screwable to the female-threaded inner wall; and a lift mechanism to vertically move the lifter pin relative to the body.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
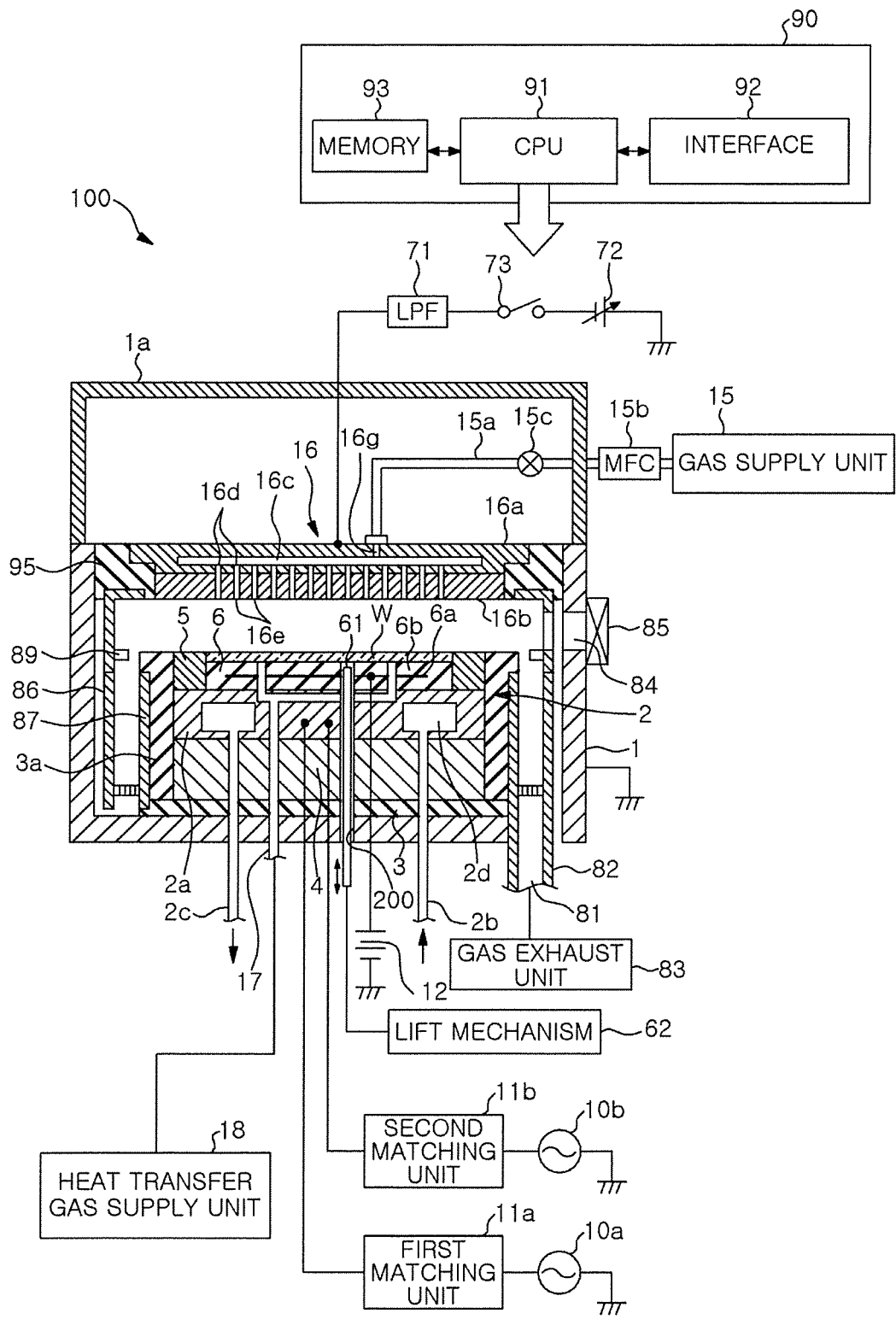
FIG. 1 is a schematic cross-sectional view showing an example of a configuration of a substrate processing apparatus according to a first embodiment.

Hereinafter, embodiments of the present disclosure will be described in detail with reference to the accompanying drawings. Like reference numerals will be given to like or corresponding parts throughout this specification and the drawings and redundant description thereof will be omitted.

(Configuration of the Substrate Support According to the First Embodiment)

As shown in FIG. 1, a substrate processing apparatus 100 according to a first embodiment includes a substrate support according to the first embodiment. FIG. 1 is a schematic cross-sectional view showing an example of a configuration of the substrate processing apparatus 100 according to the first embodiment. The substrate processing apparatus 100 includes an airtight processing chamber (plasma processing chamber) 1 that is electrically grounded. The processing chamber 1 has a cylindrical shape and is made of, e.g., aluminum or the like. The processing chamber 1 defines a processing space where plasma is generated. A substrate support body 2 for supporting a wafer W that is a target object (work-piece) is disposed in the processing chamber 1. The substrate support body 2 includes a base 2a and an electrostatic chuck (ESC) 6. The base 2a is made of a conductive metal, e.g., aluminum or the like, and serves as a lower electrode. The electrostatic chuck 6 is made of ceramic, such as alumina, and configured to attract and hold the wafer W. The substrate support body 2 is supported by a support 4. The support 4 is made of a conductor. The support 4 is supported by a supporting member 3 made of, e.g., quartz or the like. An edge ring 5 made of, e.g., silicon, is disposed on an upper outer peripheral portion of the substrate support body 2. In the processing chamber 1, a cylindrical inner wall member 3a made of, e.g., quartz or the like, is disposed to surround a periphery of the substrate support body 2 and a periphery of the support 4.

A first radio frequency (RF) power supply 10a is connected to the base 2a through a first matching unit 11a and a second radio frequency (RF) power supply 10b is connected to the base 2a through a second matching unit 11b. The first RF power supply 10a is configured to supply a radio-frequency power for plasma generation, which has a predetermined frequency, to the base 2a. The second RF power supply 10b is configured to supply a radio-frequency power for ion attraction (for bias), which has a frequency lower than that of the first RF power supply 10, to the base 2a. The first RF power supply 10a may function as at least a part of a plasma generator.

A shower head 16 serving as an upper electrode is disposed above the substrate support body 2 to be opposite to the substrate support body 2 in parallel therewith. With this configuration, the shower head 16 and the base 2a function as a pair of electrodes.

The electrostatic chuck 6 has a flat disc shape. The electrostatic chuck 6 has a structure in which an electrode 6a is embedded in an insulator 6b. A DC power supply 12 is connected to the electrode 6a. The wafer W is attracted and held on the electrostatic chuck 6 by a Coulomb force generated by applying a DC voltage from the DC power supply 12 to the electrode 6a.

A coolant flow path 2d is formed in the base 2a. The coolant flow path 2d is connected to a coolant inlet line 2b and a coolant outlet line 2c. By circulating an appropriate coolant, e.g., cooling water or the like, through the coolant flow path 2d, a temperature of the substrate support body 2 is controlled to a predetermined temperature.

A gas supply line 17 for supplying a cold heat transfer gas (hereinafter, also referred to as "heat transfer gas") such as helium gas or the like to the backside of the wafer W is disposed to extend through the substrate support body 2 and the like. The gas supply line is connected to a heat transfer gas supply unit 18. Since the gas supply line 17 is formed through the substrate support body 2, a through-hole is formed in the substrate support body 2. With this configuration, the temperature of the wafer W on the substrate support body 2 is controlled to a predetermined temperature.

A plurality of, e.g., three pin through-holes 200 (only one is shown in FIG. 1) is formed in the substrate support body 2. Lifter pins 61 are disposed inside the pin through-holes 200, respectively. The lifter pins 61 are connected to a lift mechanism 62. The lifter pins 61 are rotated in a clockwise/counterclockwise direction and vertically moved by the lift mechanism 62.

The shower head 16 is disposed at a ceiling wall portion of the processing chamber 1. The shower head 16 includes a main body 16a and a ceiling plate 16b serving as an electrode plate. The shower head 16 is supported at an upper portion of the processing chamber 1 through an insulating member 95. The main body 16a is made of a conductive material, e.g., aluminum having an anodically oxidized surface. The ceiling plate 16b is detachably attached to a bottom portion of the main body 16a.

A gas diffusion space 16c is formed in the main body 16a. A plurality of gas holes 16d is formed in a bottom portion of the main body 16a to be positioned under the gas diffusion space 16c. Gas injection holes 16e are formed through the ceiling plate 16b in a thickness direction thereof. The gas injection holes 16e communicate with the gas holes 16d, respectively.

A gas inlet port 16g for introducing a processing gas into the gas diffusion space 16c is formed in the main body 16a. One end of a gas supply line 15a is connected to the gas inlet port 16g and the other end of the gas supply line 15a is connected to a gas supply unit 15 for supplying the processing gas. A mass flow controller (MFC) 15b and an opening/closing valve 15c are disposed in the gas supply line 15a in that order from an upstream side. The processing gas for plasma etching is supplied from the gas supply unit 15 to the gas diffusion space 16c through the gas supply line 15a. With this configuration, the processing gas supplied to the gas diffusion space 16c is diffused and supplied in a shower-like manner into the processing chamber 1 through the gas holes 16d and the gas injection holes 16e.

A variable DC power supply 72 is electrically connected to the shower head 16 through a low pass filter (LPF) 71. The power supply of the variable DC power supply can be on/off controlled by an on/off switch 73. A current and a voltage of the variable DC power supply 72 and on/off operation of the on/off switch 73 are controlled by a controller 90. When plasma is generated in the processing space by applying the radio frequency (RF) power from the first RF power supply 10a and the second RF power supply 10b to the substrate support body 2, the on/off switch 73 is turned on by the controller 90 and a predetermined DC voltage is applied to the shower head 16, if necessary.

A cylindrical ground conductor 1a extends upward from a sidewall of the processing chamber 1 to be located at a position higher than the shower head 16. The ground conductor 1a has a ceiling wall at the top thereof.

A gas exhaust port 81 is formed at a bottom portion of the processing chamber 1. A gas exhaust unit 83 is connected to the gas exhaust port 81 through a gas exhaust line 82. The gas exhaust unit 83 has a vacuum pump. By operating the vacuum pump, a pressure in the processing chamber 1 can be decreased to a predetermined vacuum level. A loading/unloading port 84 for the wafer W is disposed at the sidewall of the processing chamber 1. A gate valve 85 for opening or closing the loading/unloading port 84 is disposed at the loading/unloading port 84.

A deposition shield 86 is disposed along an inner surface of the sidewall of the processing chamber 1. The deposition shield 86 prevents etching by-products (deposits) from being attached to the processing chamber 1. A conductive member (GND block) 89 is disposed at a portion of the deposition shield 86 at a height position substantially same as the height of the wafer W. The conductive member 89 is connected to the ground such that a potential for the ground can be controlled. Due to the presence of the conductive member 89, abnormal discharge can be prevented. Further, a deposition shield 87 extending along the inner wall member 3a is disposed in parallel with a lower portion of the deposition shield 86. The deposition shield 86 and 87 are detachably provided.

The substrate processing apparatus 100 further includes the controller 90. The controller 90 includes a central processing unit (CPU) 91 for controlling the respective components of the substrate processing apparatus 100, an interface 92, and a memory 93.

The interface 92 includes a keyboard through which a process manager inputs commands to operate the substrate processing apparatus 100, a display for visualizing an operation status of the substrate processing apparatus 100, and the like.

The memory 93 stores therein recipes including control programs, processing condition data and the like for realizing various processes performed by the substrate processing apparatus 100 under the control of the CPU 91. If necessary, a certain recipe is retrieved from the memory 93 by an input command from the interface 92 and executed by the CPU 91, so that a predetermined process is performed in the substrate processing apparatus 100. The recipes including the control programs, the processing condition data and the like can be stored in a computer-readable computer storage medium (e.g., a hard disk, a CD, a flexible disk, a semiconductor memory, or the like). Alternatively, the recipes including the control programs, the processing condition data and the like can be transmitted, when needed, from another apparatus through, e.g., a dedicated line, and used online.

(Configuration of the Substrate Support Body 2)

Next, an example of the configuration of the substrate support body 2 will be described with reference to FIG. 2.

Figure 2:
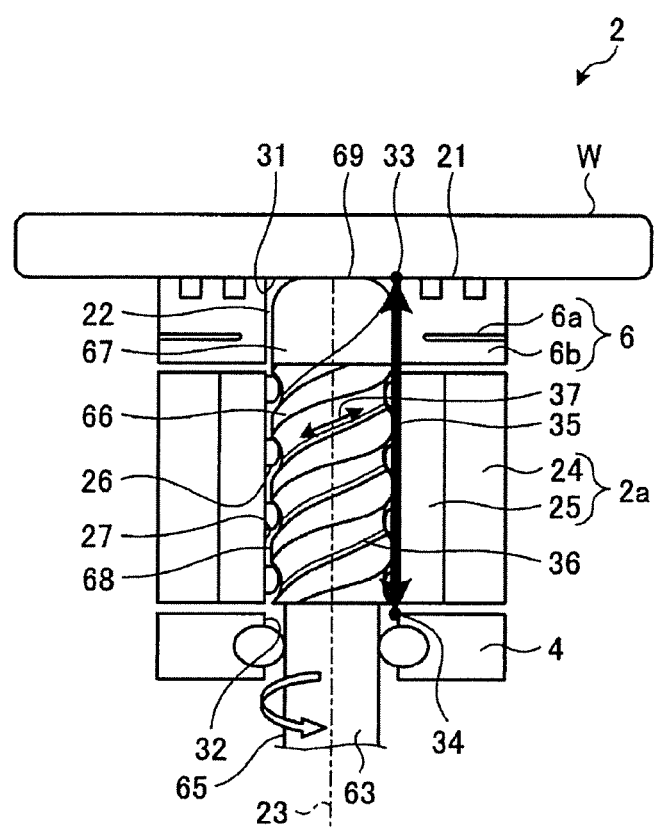
FIG. 2 is a schematic cross-sectional view showing an example of a body (substrate support body) of the substrate processing apparatus according to the first embodiment.

FIG. 2 is a schematic cross-sectional view showing an example of the substrate support body 2 of the substrate processing apparatus 100 according to the first embodiment. The substrate support body 2 has a substrate supporting surface 21. The substrate supporting surface 21 corresponds to the top surface of the electrostatic chuck 6 and is formed in a dot shape. One pin through-hole 22 among the multiple pin through-holes 200 is formed along a rotation axis 23 to surround the rotation axis 23 that is perpendicular to a plane extending along the substrate supporting surface 21. Although the substrate supporting surface 21 is formed in a dot shape in FIG. 2, the substrate supporting surface 21 may be formed in a flat shape.

The base 2a includes a base main body 24 and a ceramic sleeve 25. The base main body 24 is made of a conductive metal such as aluminum. The above-described coolant flow path 2d is formed in the base main body 24. The ceramic sleeve 25 is made of an insulator such as ceramic. The ceramic sleeve 25 is formed in a substantially tubular shape and has an inner wall 27. The ceramic sleeve 25 is disposed such that the inner wall 27 surrounds the pin through-hole 22, and the ceramic sleeve 25 is fixed to the base main body 24. A female thread 26 is formed on the inner wall 27.

One lifter pin 63 among the multiple lifter pins 61, which is inserted into the pin through-hole 22, is made of an insulator and has a substantially rod shape. The lifter pin 63 is disposed to extend along the rotation axis 23 and is supported by the substrate support body 2 to be rotatable about the rotation axis 23. The lifter pin 63 is supported by the substrate support body 2 to be vertically movable in parallel with the rotation axis 23 so that the lifter pin 63 can be located at a storing position (lower position) or a transfer position (upper position).

The lifter pin 63 has a base segment 65, an intermediate segment 66, and a leading segment 67. The base segment 65 is formed in a cylindrical shape and has a diameter smaller than a minor diameter of the female thread 26. When the lifter pin 63 is located at the storing position, the base segment 65 is disposed in a region of the pin through-hole 22 surrounded by the support 4 and is supported by the above-described lift mechanism 62.

The intermediate segment 66 is fixed onto the base segment 65. When the lifter pin 63 is located at the storing position, the intermediate segment 66 is disposed in a region of the pin through-hole 22 surrounded by the base 2a. A male thread 68 is formed on the intermediate segment 66. A minor diameter of the male thread 68 is smaller than the minor diameter of the female thread 26. A major diameter of the male thread 68 is smaller than a major diameter of the female thread 26 and is greater than the minor diameter of the female thread 26. Therefore, when the lifter pin 63 is located at the storing position, the male thread 68 is fitted to the female thread 26.

The leading segment 67 is fixed onto the intermediate segment 66 and has a top face 69 of the lifter pin 63 that is a portion of the lifter pin 63 closer to the shower head 16 so that the intermediate segment 66 is disposed between the base segment 65 and the leading segment 67. When the lifter pin 63 is located at the storing position, the leading segment 67 is disposed in a region of the pin through-hole 22 surrounded by the electrostatic chuck 6. Further, when the lifter pin 63 is located at the storing position, the leading segment 67 is disposed below the plane extending along the substrate supporting surface 21 and is not in contact with the wafer W mounted on the substrate support body 2. The top face 69 of the leading segment 67 is coated with a coating film made of silicon carbide (SiC).

When the lifter pin 63 is located at the storing position, the wafer W that is mounted on the substrate support body 2 has a wafer exposed portion 31 exposed to the inside of the pin through-hole 22. Further, the support 4 has a support exposed portion 32 exposed to the inside of the pin through-hole 22. At this time, a certain line segment 35, which connects a certain point 33 of the wafer exposed portion 31 and a certain point 34 of the support exposed portion 32, necessarily intersects with the lifter pin 63 having the male thread 68 or the ceramic sleeve 25 having the female thread 26. Further, a path 36 that passes through a gap between the female thread 26 and the male thread 68 is formed inside the pin through-hole 22. By following the path 36, the point 33 of the wafer exposed portion 31 and the point 34 of the support exposed portion 32 can be connected. The path 36 has a screw structure and the length of the path 36 is longer than that of the line segment 35. Further, when the lifter pin 63 is located at the storing position, a plurality of straight paths that do not intersect with the substrate support body 2 or the lifter pin 63 is formed inside the pin through-hole 22. These paths include, e.g., paths 37, each of which is formed in a gap between the female thread 26 and the male thread 68 along a part of the root of the female thread 26. The length of the path 37 is shorter than that of the line segment 35. In other words, due to the presence of the multiple straight paths dividing the path 36, the distance the electron has for acceleration is shortened. Therefore, the occurrence of electron avalanche is prevented, thereby preventing the occurrence of abnormal discharge.

Figure 3:
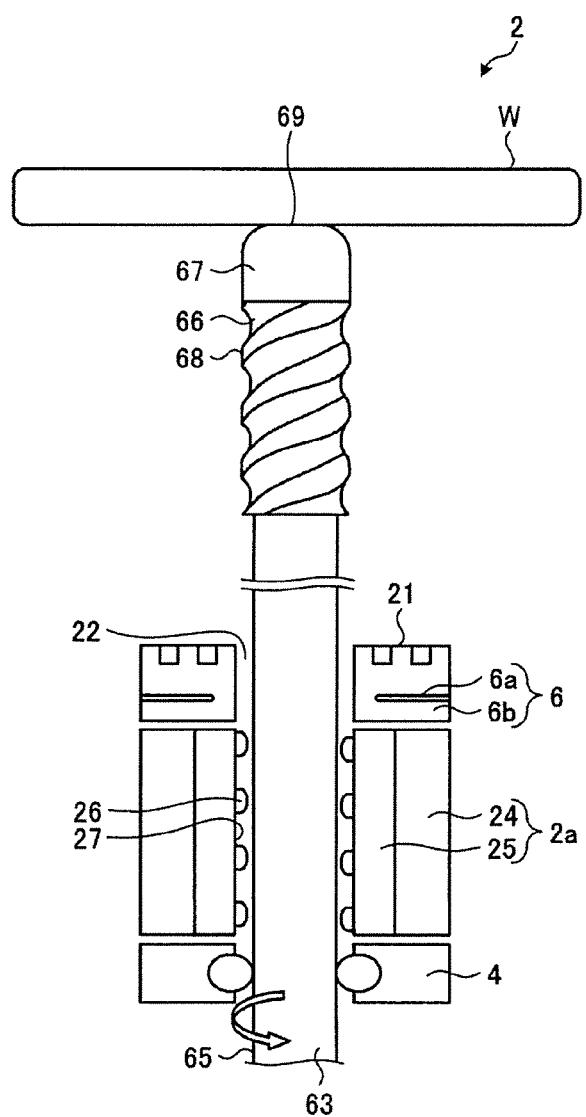
FIG. 3 is a schematic cross-sectional view showing an example of the body of the substrate processing apparatus according to the first embodiment in the case where a lifter pin is located at a transfer position.

FIG. 3 is a schematic cross-sectional view showing an example of the substrate support body 2 of the substrate processing apparatus 100 according to the first embodiment in the case where the lifter pin 63 is located at the transfer position. When the lifter pin 63 is located at the transfer position, a part of the base segment 65 is disposed in a region of the pin through-hole 22 surrounded by the ceramic sleeve 25. Further, when the lifter pin 63 is located at the transfer position, the intermediate segment 66 is disposed above the region of the pin through-hole 22 surrounded by the ceramic sleeve 25. At this time, the male thread 68 is released from the female thread 26. When the lifter pin 63 is located at the transfer position, the leading segment 67 is disposed above the plane extending along the substrate supporting surface 21.

A pin through-hole(s) different from the pin through-hole 22 among the multiple pin through-holes 200 has a female thread, similar to the pin through-hole 22. A lifter pin(s) different from the lifter pin 63 among the multiple lifter pins 61 has a male thread, similar to the lifter pin 63. The lift mechanism 62 raises or lowers the lifter pins simultaneously so that the top faces 69 of the lifter pins 61 are constantly overlapped with another plane that is substantially parallel with the plane extending along the substrate supporting surface 21. In other words, when the lifter pins 61 are located at the storing position, the wafer W can be mounted on the substrate support body 2 such that the wafer W is in contact with the substrate supporting surface 21 without being in contact with the top faces 69 of the lifter pins 61. When the lifter pins 61 are located at the transfer position, the wafer W can be mounted on the lifter pins 61 such that the wafer W is not in contact with the substrate supporting surface 21 of the substrate support body 2. At this time, the top faces 69 of the lifter pins 61 are sufficiently separated from the substrate supporting surface 21 so that the wafer W loaded into the processing space of the processing chamber 1 through the loading/unloading port 84 can be appropriately mounted on the lifter pins 61. The wafer W mounted on the lifter pins located at the transfer position are sufficiently separated from the substrate supporting surface 21 so that the wafer W can be appropriately unloaded from the processing space of the processing chamber 1 through the loading/unloading port 84.

(Operation of the Substrate Processing Apparatus 100)

When the wafer W is not mounted on the substrate support body 2, i.e., when the lifter pins 61 are not located at the upper portions, the controller 90 controls the lift mechanism 62 to locate the lifter pins 61 at the transfer position. In other words, when the lifter pins 61 are located at the storing position, the controller 90 controls the lift mechanism 62 to rotate the lifter pins 61 in a positive direction at a predetermined rotation speed. The male thread 68 slides along the female thread 26 as the lifter pins 61 are rotated in the positive direction at the predetermined rotation speed and, thus, the lifter pins 61 are raised at a predetermined low speed. When the lifter pins 61 are raised from the storing position to a height equal to or greater than a predetermined height, the male thread 68 is released from the female thread 26. After the male thread 68 is released from the female thread 26, the controller 90 controls the lift mechanism 62 to raise the lifter pins 61 at a predetermined high speed without rotating the lifter pins 61 to thereby locate the lifter pins 61 at the transfer position.

Then, the controller 90 controls the gate valve 85 to open the loading/unloading port 84. When the loading/unloading port 84 is opened, the wafer W is loaded into the processing space of the processing chamber 1 through the loading/unloading port 84 and mounted on the lifter pins 61 located at the transfer position. After the wafer W is mounted on the lifter pins 61, the controller 90 controls the lift mechanism 62 to lower the lifter pins 61 at a predetermined high speed without rotating the lifter pins 61. While the lifter pins 61 are lowered from the transfer position, the male thread 68 bumps into the female thread 26. After the male thread 68 bumps into the female thread 26, the controller 90 controls the lift mechanism 62 to rotate the lifter pins 61 in a negative direction at a predetermined rotation speed. The male thread 68 is screwed into the female thread 26 as the lifter pins 61 are rotated in the negative direction at the predetermined rotation speed and, thus, the lifter pins 61 are lowered at a predetermined low speed. The controller 90 controls the lift mechanism 62 to stop the negative rotation of the lifter pins 61 when the lifter pins 61 are located at the storing position, so that the lifter pins 61 can be located at the storing position. When the lifter pins 61 are located at the storing position, the wafer W is separated from the top faces 69 of the lifter pins 61 and is mounted on the substrate support body 2 while being in contact with the substrate supporting surface 21.

After the wafer W is appropriately mounted on the substrate support body 2, the controller 90 controls the DC power supply 12 to apply a DC voltage to the electrode 6a of the electrostatic chuck 6. The wafer W is attracted and held on the substrate support body 2 by the Coulomb force. After the wafer W is attracted and held on the substrate support body 2, the controller 90 controls the gate valve 85 to close the loading/unloading port 84.

After the loading/unloading port 84 is closed, the controller 90 controls the gas exhaust unit 83 to evacuate the processing space to a predetermined vacuum level. The controller 90 controls the gas supply unit 15 to supply a processing gas at a predetermined flow rate to the gas inlet port 16g while controlling the opening/closing valve 15c. The processing gas supplied from the gas supply unit 15 to the gas inlet port 16g is supplied into the gas diffusion space 16c and then is supplied in a shower-like manner into the processing space of the processing chamber 1 through the gas holes 16d and the gas injection holes 16e.

When the wafer W is attracted and held on the substrate support body 2, the controller 90 controls the heat transfer gas supply unit 18 to supply the cold heat transfer gas to the gap between the substrate support body 2 and the wafer W through the gas supply line 17. The cold heat transfer gas supplied to the gap between the substrate support body 2 and the wafer W is supplied into the pin through-holes 200 and fills the pin through-holes 200. The controller 90 further controls a chiller unit (not shown) to circulate the coolant whose temperature has been controlled to a predetermined temperature through the coolant flow path 2d. Accordingly, the temperature of the substrate support body 2 is controlled, and further, the temperature of the wafer W held on the substrate support body 2 is controlled.

When the temperature of the wafer W is controlled to a predetermined temperature, the controller 90 controls the first RF power supply 10a and the second RF power supply 10b to supply the radio-frequency power to the base 2a of the substrate support body 2. By supplying the radio-frequency power to the base 2a of the substrate support body 2, plasma is generated in a region between the substrate support body 2 and the shower head 16 in the processing space. Then, the controller 90 controls the variable DC power supply 72 and the on/off switch 73 to apply a predetermined DC voltage from the variable DC power supply 72 to the shower head 16. At this time, a predetermined portion on the surface of the wafer W that face the shower head 16 is etched by the plasma generated in the processing space.

After the wafer W is appropriately etched, the controller 90 controls the first RF power supply 10a and the second RF power supply 10b to stop the supply of the radio-frequency power to the base 2a of the substrate support body 2. Further, the controller 90 controls the variable DC power supply 72 and the on/off switch 73 to stop the application of the DC voltage to the shower head 16. In addition, the controller 90 controls the DC power supply 12 to stop the application of the DC voltage to the electrode 6a of the electrostatic chuck 6, and then the wafer W is released from the substrate support body 2.

After the wafer W is released from the substrate support body 2, the controller 90 controls the lift mechanism 62 to rotate the lifter pins 61 in the positive direction at a predetermined rotation speed. As the lifter pins 61 are rotated in the positive direction at the predetermined rotation speed, the lifter pins 61 are raised at a low speed. The male thread 68 is released from the female thread 26 when the lifter pins 61 are raised from the storing position to a predetermined height or higher. After the male thread 68 is released from the female thread 26, the controller 90 controls the lift mechanism 62 to raise the lifter pins 61 at a high speed without rotating the lifter pins 61 to locate the lifter pins 61 at the transfer position. When the lifter pins 61 are raised, the wafer W is brought into contact with the top faces 69 of the lifter pins 61 and separated from the substrate support body 2 while being supported by the lifter pins 61. By locating the lifter pins 61 at the transfer position, the wafer W is sufficiently separated from the substrate support body 2.

Then, the controller 90 controls the gate valve 85 to open the loading/unloading port 84. When the loading/unloading port 84 is opened, the wafer W that is sufficiently separated from the substrate support body 2 is unloaded from the processing space of the processing chamber 1 through the loading/unloading port 84.

Figure 4:
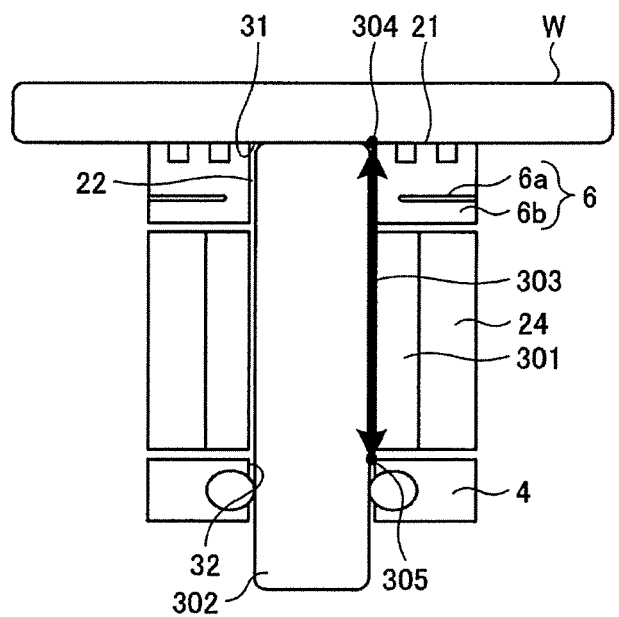
FIG. 4 is a schematic cross-sectional view showing a body (substrate support body) of a substrate processing apparatus according to a comparative example.

FIG. 4 is a schematic cross-sectional view showing a substrate support body of a substrate processing apparatus according to a comparative example. In the substrate processing apparatus according to the comparative example, the ceramic sleeve 25 of the substrate processing apparatus 100 according to the first embodiment is replaced with another ceramic sleeve 301, and the lifter pin 63 of the substrate processing apparatus 100 according to the first embodiment is replaced with another lifter pin 302. The ceramic sleeve 301 is formed in a substantially tubular shape and has no female thread on a surface thereof facing the pin through-hole 22. The inner wall of the ceramic sleeve 301 is formed in a tube shape to correspond to the side surface of a cylinder. The lifter pin 302 is formed in a rod shape and has no male thread protruding outward. The surface of the lifter pin 302 facing the ceramic sleeve 301 is formed to correspond to the side surface of the cylinder.

In the substrate processing apparatus according to the comparative example, when etching is performed, a potential difference is generated between the support 4 and the wafer W in contact with the substrate supporting surface 21. The potential difference causes abnormal discharge inside the pin through-holes 200.

In the substrate processing apparatus according to the comparative example, when the lifter pin 302 is located at the storing position, a point 304 of the wafer exposed portion 31 and a point 305 of the support exposed portion 32 can be connected through a path 303 that does not intersect with the lifter pin 302 and the ceramic sleeve 301. The path 303 is a line segment that is substantially in parallel with a straight line formed along the pin through-hole 22. In the substrate processing apparatus according to the comparative example, an inter-electrode distance between the support 4 and the wafer W in contact with the substrate supporting surface 21 is equal to the length of the path 303. The length of the path 303 is shorter than the length of the path 36 in the substrate processing apparatus 100 according to the first embodiment. The inter-electrode distance between the support 4 and the wafer W in contact with the substrate supporting surface 21, i.e., the length of the path 36, in the substrate processing apparatus 100 according to the first embodiment is longer than that of the path 303 between the support 4 and the wafer W in contact with the substrate supporting surface 21 in the substrate processing apparatus according to the comparative example.

Figure 5:
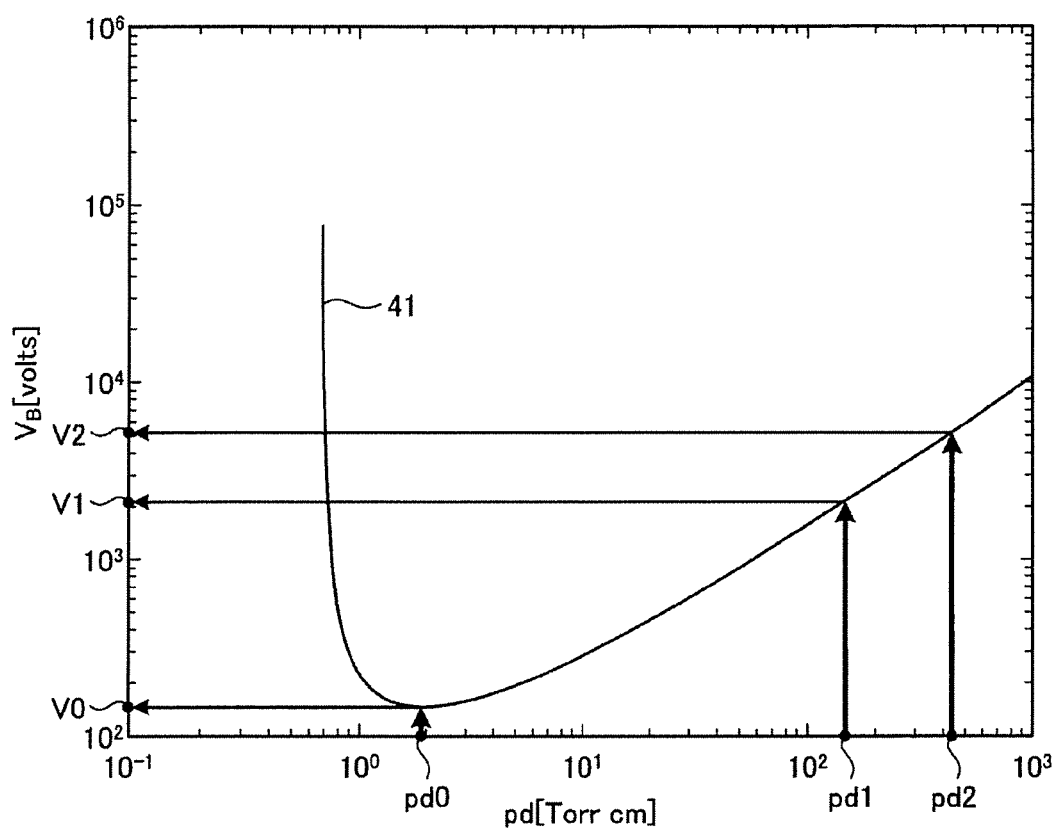
FIG. 5 shows a minimum discharge voltage according to Paschen's law.

FIG. 5 shows a minimum discharge voltage according to Paschen's law. It is known that when a voltage higher than the minimum discharge voltage V is applied to two electrodes arranged to respectively extend along two parallel planes, discharge occurs between the two electrodes. The Paschen curve 41 shown in FIG. 5 shows that the minimum discharge voltage V is a function of a product pd obtained by multiplying an inter-electrode distance d by a gas pressure p. The inter-electrode distance d indicates the distance between the two electrodes. The gas pressure p indicates the pressure of the cold heat transfer gas (He) filled in the atmosphere between the two electrodes.

The Paschen curve 41 shows that the minimum discharge voltage V is equal to the minimum value V0 when the product pd is a value pd0. The Paschen curve 41 shows that the minimum discharge voltage V monotonically increases with respect to the product pd when the product pd becomes greater than the value pd0 that indicates the minimum discharge voltage V increases as the product pd increases. The Paschen curve 41 shows that when the product pd is greater than the value pd0 and the gas pressure p is constant, the minimum discharge voltage V increases as the inter-electrode distance d increases.

When the wafer W is etched by the substrate processing apparatus according to the comparative example, the gas pressure p of the cold heat transfer gas filled in the pin through-hole 22 is substantially equal to 50 Torr. The inter-electrode distance d between the support 4 and the wafer W in contact with the substrate supporting surface 21 in the substrate processing apparatus according to the comparative example is equal to the length of the line segment 35 that is about 3 cm. Therefore, the value pd1 of the product pd in the substrate processing apparatus according to the comparative example is about 150 Torr·cm, as shown in the following equation:

$$pd1=50\times3=150.$$

The minimum discharge voltage V in the substrate processing apparatus according to the comparative example is equal to the value V1 corresponding to the value pd1 in the Paschen curve 41 that is about 2000 V.

When the wafer W is etched by the substrate processing apparatus 100 according to the first embodiment, the gas pressure p of the cold heat transfer gas filled in the pin through-hole 22 is equal to the gas pressure p in the substrate processing apparatus according to the comparative example that is about 50 Torr. The inter-electrode distance d between the support 4 and the wafer W in contact with the substrate supporting surface 21 in the substrate processing apparatus 100 according to the first embodiment is equal to the length of the path 36. That is, the inter-electrode distance d is equal to about 9(=3 cm×3)cm in the case of using the ceramic sleeve 25 having a screw structure that has a length three times longer than that of the line segment 35. Therefore, the value pd2 of the product pd in the substrate processing apparatus 100 according to the first embodiment is about 450 Torr·cm as shown in the following equation:

$$pd2=50\times9=450.$$

The minimum discharge voltage V in the substrate processing apparatus 100 according to the first embodiment is equal to the value V2 corresponding to the value pd2 in the Paschen curve 41 that is about 5000 V. The Paschen curve 41 shows that value V2 is greater than value V1.

The graph showing that the value V2 is greater than the value V1 explains that the abnormal discharge is unlikely to occur in the pin through-hole 22 at the time of etching the wafer W in the substrate processing apparatus 100 according to the first embodiment compared to the case in the substrate processing apparatus according to the comparative example.

Further, the Paschen curve 41 shows that when the product pd is smaller than the value pd0, the minimum discharge voltage V monotonically decreases with respect to the product pd and that the minimum discharge voltage V increases as the product pd decreases. The Paschen curve 41 shows that when the product pd is smaller than the value pd0 and the gas pressure p is constant, the minimum discharge voltage V increases as the inter-electrode distance d decreases and the discharge is unlikely to occur as the inter-electrode distance d decreases. This indicates that when the length of the straight path along which the electrons are accelerated by the voltage in the space between the two electrodes is short, the electrons are not accelerated to the extent that the electron avalanche occurs between the two electrodes so that the discharge is unlikely to occur between the two electrodes.

The maximum value of the lengths of the multiple straight paths that are formed inside the pin through-hole 22 without intersecting the substrate support body 2 or the lifter pin 63 in the substrate processing apparatus 100 according to the first embodiment is smaller than the maximum value of the lengths of the multiple paths in the substrate processing apparatus according to the comparative example. Therefore, the electrons are not accelerated to the extent that the electron avalanche occurs and the abnormal discharge is unlikely to occur in the pin through-hole 22 of the substrate processing apparatus 100 according to the first embodiment compared to the case in the pin through-hole 22 of the substrate processing apparatus according to the comparative example.

Due to the presence of the female thread 26 and the male thread 68, a region in the pin through-hole 22 where a path longer than a predetermined length is disposed in the substrate processing apparatus 100 according to the first embodiment is smaller in size than that in the substrate processing apparatus according to the comparative example. Therefore, the number of electrons that are sufficiently accelerated to the extent that the electron avalanche occurs in the pin through-hole 22 of the substrate processing apparatus 100 according to the first embodiment is smaller than that in the pin through-hole 22 of the substrate processing apparatus according to the comparative example. Accordingly, the abnormal discharge is unlikely to occur in the pin through-hole 22 of the substrate processing apparatus 100 according to the first embodiment compared to the case in the pin through-hole 22 of the substrate processing apparatus according to the comparative example.

The abnormal discharge that occurs in the pin through-hole 22 may damage the wafer W, which may result in a decrease in the yield of the etching process. Since the discharge is unlikely to occur in the pin through-hole 22 of the substrate processing apparatus according to the first embodiment, it is possible to reduce the damage of the wafer W and improve the yield of the etching process, compared to the substrate processing apparatus according to the comparative example.

As described above, the substrate support according to the first embodiment includes the substrate support body 2, the lifter pin 63, and the lift mechanism 62. The wafer W to be processed using plasma is mounted on the substrate support body 2. The lifter pin 63 is inserted into the pin through-hole 22 formed in the substrate support body 2. The lift mechanism 62 raises or lowers the wafer W by raising or lowering the lifter pin 63 with respect to the substrate support body 2. The male thread 68 is formed on a portion of the lifter pin 63 facing the inner wall 27 of the pin through-hole 22. The female thread 26 to be fitted to the male thread 68 is formed on the inner wall 27 of the pin through-hole 22.

When the wafer W mounted on the substrate support body 2 is processed using the plasma, a potential difference is applied in the pin through-hole 22 between the wafer W and the support 4 disposed at an end portion of the pin through-hole 22 that is distant from the wafer W. In the substrate support according to the first embodiment, the male thread 68 is fitted to the female thread 26, so that the length of the path along which the electrons are accelerated by the high potential in the pin through-hole 22 can be shortened compared to the substrate support in the substrate processing apparatus according to the comparative example. Further, in the substrate support according to the first embodiment, since the length of the path along which the electrons are accelerated by the high potential in the pin through-hole 22 is shortened, it is possible to suppress electrons from being sufficiently accelerated in the pin through-hole 22. Further, in the substrate support according to the first embodiment, the gas filled in the pin through-hole 22 can be prevented from being ionized by preventing the electrons from being sufficiently accelerated in the pin through-hole 22. Accordingly, it is possible to prevent the electron avalanche from occurring in the pin through-hole 22. In the substrate support according to the first embodiment, the occurrence of the abnormal discharge in the pin through-hole 22 can be avoided by preventing the electron avalanche from occurring in the pin through-hole 22.

Further, the lifter pin 63 of the substrate support according to the first embodiment has a configuration that the male thread 68 is released from the female thread 26 when the wafer W is raised from the substrate support body 2 by the lifter pin 63. When the male thread 68 is released from the female thread 26, the lift mechanism 62 raises or lowers the lifter pin 63 without rotating the lifter pin 63 so that the wafer W is raised or lowered without rotating the lifter pin 63. In the substrate support according to the first embodiment, the wear of the lifter pin 63 and the wear of the wafer W due to the rotation of the lifter pin 63 can be reduced by raising or lowering the wafer W without rotating the lifter pin 63.

Further, while the male thread 68 is fitted to the female thread 26, the lift mechanism 62 of the substrate support according to the first embodiment rotates the lifter pin 63 to vertically move the lifter pin 63 at a first rate. While the male thread 68 is released from the female thread 26, the lift mechanism 62 raises or lowers the lifter pin 63 at a second rate different from the first rate. For example, a high lifting speed at which the lifter pin 63 is raised without rotation while the male thread 68 is released from the female thread 26 is higher than a low lifting speed at which the lifter pin 63 is raised while rotating in the positive direction at a predetermined rotation speed while the male thread 68 is fitted to (screwed into) the female thread 26. A high lowering speed at which the lifter pin 63 is lowered without rotation while the male thread 68 is released from the male thread 26 is higher than a low lowering speed at which the lifter pin 63 is lowered while rotating in the negative direction at a predetermined rotation speed while the male thread 68 is fitted to (screwed into) the female thread 26. In comparison to a substrate support for raising or lowering the wafer W at the low lifting speed or at the low lowering speed while the male thread 68 is released from the female thread 26, the substrate support according to the first embodiment can raise or lower the wafer W at a high speed (increased speed) by raising or lowering the lifter pin 63 at a high speed. The substrate processing apparatus 100 including the substrate support according to the first embodiment can improve the throughput of the processing of the wafer W per unit time by raising or lowering the wafer W at a high speed.

Further, the top face 69 of the lifter pin 63 of the substrate support according to the first embodiment, which is brought into contact with the wafer W, is coated with silicon carbide (SiC) that is less likely to be worn than a semiconductor forming the wafer W. Therefore, in the substrate support according to the first embodiment, the wear of the lifter pin 63 can be reduced even when the wafer W is raised or lowered while being in contact with the rotating lifter pin 63. Thus, the cycle of exchanging the lifter pin 63 can be increased. As described above, the top face 69 of the lifter pin 63 of the substrate support according to the first embodiment is coated with a material that is less likely to be worn than the semiconductor forming the wafer W. However, the top face 69 may be coated with a material, e.g., resin, that is more easily worn than the semiconductor forming the wafer W. In that case, the lifter pin 63 can reduce the wear of the wafer W.

Further, the substrate support body 2 of the substrate support according to the first embodiment includes the base 2a having the pin through-hole 22, and the electrostatic chuck 6 for attracting and holding the wafer W onto the base 2a using a Coulomb force. In the substrate support according to the first embodiment, the wafer W mounted on the substrate support body 2 can be appropriately held and processed using plasma. Further, in the substrate support according to the first embodiment, the electrostatic chuck 6 may be omitted. The substrate support according to the first embodiment can suppress the occurrence of the abnormal discharge even when the electrostatic chuck 6 is omitted.

The substrate processing apparatus 100 according to the first embodiment includes the substrate support according to the first embodiment and a processing unit for processing the wafer W using plasma. The processing unit includes the processing chamber 1, the first RF power supply 10a, the second RF power supply 10b, and the DC power supply 12, for example. In the substrate processing apparatus 100 according to the first embodiment, the damage of the wafer W can be reduced by suppressing the occurrence of the abnormal discharge using the substrate support according to the first embodiment. Accordingly, the product yield of the processing of the wafer W using plasma can be improved.

(Configuration of a Substrate Support According to a Second Embodiment)

Figure 6:
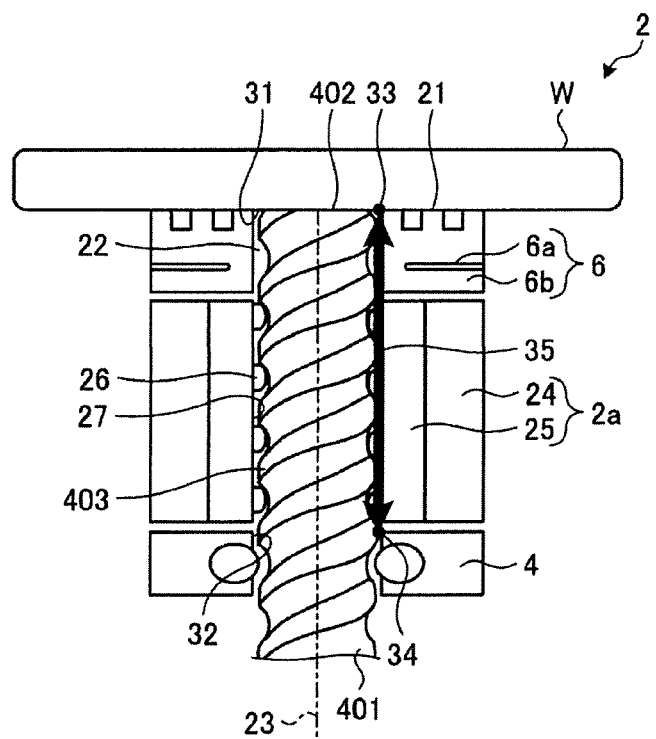
FIG. 6 is a schematic cross-sectional view showing an example of a substrate support according to a second embodiment.

The lifter pin 63 of the substrate support according to the first embodiment does not have the male thread 68 on the base segment 65 and the leading segment 67. However, the male thread 68 may be formed on the base segment 65 and the leading segment 67. As shown in FIG. 6, in the substrate support according to the second embodiment, the lifter pin 63 of the substrate support according to the first embodiment is replaced with another lifter pin 401, and other parts are the same as those of the substrate support according to the first embodiment. FIG. 6 is a schematic cross-sectional view showing an example of the substrate support according to the second embodiment.

The lifter pin 401 is made of an insulator, and has a rod shape. The lifter pin 401 is disposed to extend along the rotation axis 23 and is supported by the substrate support body 2 to be rotatable about the rotation axis 23. The lifter pin 401 is supported by the substrate support body 2 to be vertically movable in parallel with the rotating axis 23, so that the lifter pin 401 can be located at the storing position or the transfer position. When the lifter pin 401 is located at the storing position, a top face 402 of the lifter pin 401 that is a portion of the lifter pin 63 closer to the shower head 16 is disposed below the plane extending along the substrate supporting surface 21 and is not in contact with the wafer W mounted on the substrate support body 2. The top face 402 of lifter pin 401 is coated with a coating film made of silicon carbide (SiC).

A male thread 403 is formed on the lifter pin 401. A minor diameter of the male thread 403 is smaller than a minor diameter of the female thread 26. A major diameter of the male thread 403 is smaller than a major diameter of the female thread 26 and greater than the minor diameter of the female thread 26. Therefore, the male thread 403 is fitted to the female thread 26 when the lifter pin 401 is inserted into the pin through-hole 22. From the above, the lift mechanism 62 raises the lifter pin 401 by rotating the lifter pin 401 in the positive direction about the rotation axis 23 to locate the lifter pin 401 at the transfer position. Further, the lift mechanism 62 lowers the lifter pin 401 by rotating the lifter pin 401 in the negative direction about the rotation axis 23 to locate the lifter pin 401 at the storing position.

In the substrate support according to the second embodiment, the male thread 403 of the lifter pin 401 is fitted to the female thread 26 formed on the inner wall of the pin through-hole 22, so that it is possible to suppress electrons from being sufficiently accelerated inside the pin through-hole 22, similar to the substrate support according to the first embodiment. The substrate support according to the second embodiment can prevent the occurrence of abnormal discharge in the pin through-hole 22 by suppressing the electrons from being sufficiently accelerated inside the pin through-hole 22. Further, the raising or lowering of the lifter pin 401 without rotation in parallel with the rotation axis 23 is not performed by the lift mechanism 62 of the substrate support according to the second embodiment. Therefore, a simpler structure can be achieved compared to the lift mechanism 62 in the substrate support according to the first embodiment.

Since the lift mechanism 62 of the substrate support according to the second embodiment has a simpler structure compared to that of the substrate support according to the first embodiment, the manufacturing cost can be reduced.

The lift mechanism 62 of the substrate support according to the first embodiment has a function of rotating the lifter pin 63. However, when the male thread 68 and the female thread 26 have sufficiently large lead angles, the mechanism for rotating the lifter pin 63 may be omitted. For example, when the lifter pin 63 is raised or lowered, the male thread 26 rotates while sliding along the female thread 26 due to the sufficiently large lead angles. Therefore, even when the male thread 68 is fitted to the female thread 26, the lift mechanism 62 can appropriately raise or lower the lifter pin 63 without rotating the lifter pin 63. In the substrate support that does not have the mechanism for rotating the lifter pin 63, it is possible to suppress the acceleration of the electrons and the occurrence of abnormal discharge inside the pin through-hole 22 due to the engagement between the male thread 68 and the female thread 26, similar to the substrate support according to the first embodiment. The substrate support that does not have the mechanism for rotating the lifter pin 63 has a simpler structure compared to the substrate support according to the first embodiment due to the simple structure of the lift mechanism 62. Therefore, the manufacturing cost can be reduced.

The substrate support body 2 of the substrate support according to the second embodiment includes the electrostatic chuck 6. However, the electrostatic chuck 6 may be omitted. In the substrate support that does not have the electrostatic chuck 6, it is also possible to suppress the acceleration of electrons inside the pin through-hole 22 and the occurrence of abnormal discharge inside the pin through-hole 22 due to the engagement between the male thread 403 and the female thread 26, similar to the substrate support according to the first embodiment.

The substrate processing apparatus of the present disclosure can be applied to any type of apparatus using capacitively coupled plasma (CCP), inductively coupled plasma (ICP), a radial line slot antenna (RLSA), electron cyclotron resonance (ECR) plasma, helicon wave plasma (HWP).

In this specification, the wafer W has been described as an example of the target substrate. However, the substrate is not limited thereto and may be various substrates for use in a flat panel display (FPD), a printed circuit board, or the like.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A substrate support for use in a plasma processing chamber, comprising:
   a body having a pin through-hole, the pin through-hole having a female-threaded inner wall;
   a lifter pin having a base segment, an intermediate segment, and a leading segment, the lifter pin being inserted into the pin through-hole, the intermediate segment being male-threaded, the male-threaded intermediate segment being screwable to the female-threaded inner wall; and
   a lift mechanism to vertically move the lifter pin relative to the body,
   wherein the lifter pin is movable between an upper position and a lower position, and wherein the male-threaded intermediate segment of the lifter pin is released from the female-threaded inner wall while the lifter pin is at the upper position.

2. The substrate support according to claim 1, wherein the lift mechanism rotates the lifter pin to vertically move the lifter pin at a first rate while the male-threaded intermediate segment is fitted to the female-threaded inner wall; or
   the lift mechanism vertically moves the lifter pin at a second rate different from the first rate while the male-threaded intermediate segment is released from the female-threaded inner wall.

3. The substrate support according to claim 2, wherein
   a top face of the leading segment comprises a material having higher wear resistance than that of a material of the substrate.

4. The substrate support according to claim 3, further comprising:
   an electrostatic chuck.

5. The substrate support according to claim 1, wherein a top face of the leading segment comprises a material having higher wear resistance than that of a material of the substrate.

6. The substrate support according to claim 1, further comprising:
   an electrostatic chuck.

7. A plasma processing apparatus, comprising:
   a chamber having a plasma processing space;
   a plasma generator to form a plasma from at least one gas in the plasma processing space; and
   a substrate support disposed in the plasma processing space, the substrate support comprising:
   a body having a pin through-hole, the pin through-hole having a female-threaded inner wall;
   a lifter pin having a base segment, an intermediate segment, and a leading segment, the lifter pin being inserted into the pin through-hole, the intermediate segment being male-threaded, the male-threaded intermediate segment being screwable to the female-threaded inner wall; and
   a lift mechanism to vertically move the lifter pin relative to the body,
   wherein the lifter pin is movable between an upper position and a lower position, and wherein the male-threaded intermediate segment of the lifter pin is released from the female-threaded inner wall while the lifter pin is at the upper position.

8. The plasma processing apparatus according to claim 7, wherein
   the lift mechanism rotates the lifter pin to vertically move the lifter pin at a first rate while the male-threaded intermediate segment is fitted to the female-threaded inner wall; or
   the lift mechanism vertically moves the lifter pin at a second rate different from the first rate while the male-threaded intermediate segment is released from the female-threaded inner wall.

9. The plasma processing apparatus according to claim 8, wherein
   a top face of the leading segment comprises a material having higher wear resistance than that of a material of the substrate.

10. The plasma processing apparatus according to claim 9, further comprising:
    an electrostatic chuck.

11. The plasma processing apparatus according to claim 7, wherein a top face of the leading segment comprises a material having higher wear resistance than that of a material of the substrate.

12. The plasma processing apparatus according to claim 7, further comprising:
    an electrostatic chuck.

* * * * *